(12) United States Patent
Wake et al.

(10) Patent No.: US 6,713,325 B2
(45) Date of Patent: Mar. 30, 2004

(54) METHOD OF MANUFACTURING A SEMICONDUCTOR INTEGRATED CIRCUIT AND SEMICONDUCTOR INTEGRATED CIRCUIT

(75) Inventors: Miwa Wake, Chiba (JP); Yoshifumi Yoshida, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 10/267,365

(22) Filed: Oct. 9, 2002

(65) Prior Publication Data

US 2003/0129792 A1 Jul. 10, 2003

(30) Foreign Application Priority Data

Jan. 7, 2002 (JP) ......................................... 2002-000702

(51) Int. Cl.[7] ............................ H01L 21/00; H01L 21/84
(52) U.S. Cl. .................... 438/149; 438/153; 438/154; 438/479; 438/517
(58) Field of Search ........................... 257/347, 351; 438/149, 153, 154, 479, 517

(56) References Cited

U.S. PATENT DOCUMENTS 6,333,540 B1 * 12/2001 Shiozawa et al. ........... 257/351
6,433,391 B1 * 8/2002 En et al. ...................... 257/347

* cited by examiner

Primary Examiner—Thien F Tran
(74) Attorney, Agent, or Firm—Adams & Wilks

(57) ABSTRACT

Conventionally, when an electric potential of a supporting substrate is fixed, there arises a problem in that impact ions are generated even in the vicinity of embedded insulating film in the proximity of a drain due to generation of a parasitic transistor using the supporting substrate as a gate so as to be likely to cause a parasitic bipolar operation. A method of the present invention includes the steps of: forming and patterning a LOCOS reaching an embedded insulating film, a gate oxide film, a well and a polysilicon film serving as a gate electrode; forming a second conductivity type high-density impurity region in an ultra-shallow portion of each of a source region and a drain region, a second conductivity type impurity region having a low density under the second conductivity type high-density impurity region of the ultra-shallow portion, and a second conductivity type impurity region having a high density under the second conductivity type impurity region having a low density and above the embedded insulating film; forming a sidewall around the gate electrode; forming a second conductivity type impurity region in each of the source region and the drain region; forming an interlayer insulating film and forming contact holes in the source region, the drain region and the gate electrode; and forming a wiring on the interlayer insulating film.

1 Claim, 13 Drawing Sheets

METHOD OF MANUFACTURING A SEMICONDUCTOR INTEGRATED CIRCUIT AND SEMICONDUCTOR INTEGRATED CIRCUIT

BACKGROUND OF THE INVENTION

1. Field of the Invention

The present invention relates to a method of manufacturing a transistor having a structure allowing the reduction of impact ionization in a transistor formed on an SOI wafer. In particular, the present invention relates to a method of manufacturing an SOI transistor having an electric potential of a supporting substrate fixed to a GND level or a low voltage level.

2. Description of the Related Art

FIGS. 4A to 4D show a method of manufacturing a conventional SOI transistor, and FIGS. 5A and 5B are a top view and a cross-sectional view showing a structure of the conventional SO transistor. Herein, the transistor is formed by using a wafer in which a P-type semiconductor film is formed on a P-type supporting substrate through an embedded insulating film.

The conventional SOI transistor is formed in a semiconductor film 1 surrounded by a LOCOS 11 reaching an embedded insulating film as shown in FIG. 5. The transistors are completely isolated from each other by the LOCOS 11. In the case of an N-type transistor, since the semiconductor film 1 is of P-type, a transistor is formed by implanting N-type ions to source/drain regions 14 and 15.

On the other hand, in the case of a P-type transistor, the semiconductor film 1 surrounded by the LOCOS 11 is implanted with N-type ions so as to be imparted with an N-type conductivity. In this state, the source/drain regions 14 and 15 are implanted with P-type ions to form a transistor.

As a manufacturing method, as shown in FIGS. 4A to 4D, first, a nitride film 8 is grown. The formed nitride film 8 is patterned and then is thermally oxidized to form the LOCOS 11. The nitride film 8 is oxidized so that the LOCOS 11 has a thickness reaching the embedded insulating film 2. Next, ion implantation is conducted by using a resist 6 as a mask so as to form a well 7 (FIG. 4A). At this point, an energy of the ion implantation is controlled so as to have a density peak in the semiconductor film.

Next, a thermal treatment is conducted so as to activate and diffuse the implanted ions. After formation of the LOCOS 11, the formation of a gate oxide film 13, the formation of a gate electrode 12, and the ion implantation to the source/drain regions 14 and 15 of the transistor are performed. Then, an interlayer insulating film 18 is formed (FIG. 4C). Furthermore, the interlayer insulating film 18 is patterned and etched to form contacts 19 to the gate electrode 12 and the source/drain regions 14 and 15. Then, a wiring 20 is provided (FIG. 4D).

Since an electric potential of the supporting substrate 3 affects the characteristics of the transistor in the case of the SOI transistor, it is necessary to fix the electric potential of the supporting substrate 3. Therefore, the electric potential of the supporting substrate 3 is obtained from an electrically conductive pedestal adhered through an electrically conductive adhesive when the supporting substrate is to be mounted onto a package. Normally, the supporting substrate 3 is connected to a ground terminal or a power source voltage terminal.

In a conventional method of forming an SOI transistor, since the transistor formed on the semiconductor film and the supporting substrate are not electrically connected to each other because of the presence of the embedded insulating film between the supporting substrate and the semiconductor film, an electric potential of the supporting substrate is in a floating state. In the case of a fully depleted SOI transistor or the like, however, the semiconductor film is entirely depleted in its thickness direction to such a degree that the depletion reaches the embedded insulating film. Therefore, the characteristics of the transistor are greatly affected by the electric potential of the supporting substrate. As a result, a variation in the electric potential of the supporting substrate exhibits similar characteristics as the back gate effect of a bulk transistor.

Thus, it is necessary to fix the electric potential of the supporting substrate. A method of fixing the electric potential of the supporting substrate is normally conducted by adhering the supporting substrate to an electrically conductive pedestal through an electrically conductive adhesive upon mounting on a package. In this state, the electric potential of the pedestal is fixed so as to fix the electric potential of the supporting substrate. The electric potential of the supporting substrate is connected either to a ground terminal or to a power source voltage terminal. In order to fix the electric potential of the supporting substrate, there is also a method of providing a through hole penetrating through the semiconductor film and the embedded insulating film to reach a part of the supporting substrate.

In the case where the electric potential of the supporting substrate is fixed by the above-described connection methods, a parasitic transistor using the supporting substrate as a gate is formed. When the electric potential of the supporting substrate serving as the gate of the parasitic transistor is set to the GND level, a difference in the electric potential between the gate and a drain is increased. As a result, impact ionization occurs in the proximity of the drain of a body.

Unlike the SOI transistor, a parasitic transistor is not formed in a conventional bulk transistor. Therefore, although the impact ionization occurs in a concentrated manner only in the vicinity of the substrate surface in the proximity of a drain in the conventional bulk transistor, the impact ionization occurs even in the vicinity of the embedded insulating film in the proximity of the drain in addition to the vicinity of the substrate surface in the proximity of the drain in the SIO transistor due to formation of a parasitic transistor. The amount of generated impact ions is increased, so that a parasitic bipolar phenomenon, in which a hole of a pair of an electron and a hole flows into a source as a bipolar current, is likely to occur in an N-type transistor. As a result, the operation of the transistor cannot be controlled by a gate voltage.

As a method of restraining the occurrence of the parasitic bipolar phenomenon, there is a method of setting a body electric potential as shown in FIG. 6 so as to compulsively pull holes out from a body. However, since a layout of the transistor used for a bulk transistor is remarkably different from that used for the SOI transistor, a layout modification from a conventional layout becomes a great encumbrance in the case where a circuit design using the SOI device is to be achieved. Furthermore, in principle, the SOI device has a latchup free structure. Therefore, it is not necessary to provide a guard ring for the transistor, and thus is greatly effective to reduce the area. In the method of setting a body electric potential so as to compulsively pull the holes out from the body, however, the effects of the SOI device of reducing the area is disadvantageously halved.

SUMMARY OF THE INVENTION

According to the present invention, there is provided a method of manufacturing a semiconductor integrated circuit, in which a CMOS transistor is formed on a first conductivity type semiconductor film provided on a first conductivity type supporting substrate through an embedded insulating film, including the steps of: conducting thermal oxidation so as to reach the embedded insulating film to form a LOCOS for element separation between transistors; forming a gate oxide film of a first conductivity type transistor; forming a first conductivity type impurity region reaching the embedded insulating film on the semiconductor film in a region where the first conductivity type transistor is to be formed; forming a polysilicon film serving as a gate electrode of the first conductivity type transistor so as to form a second conductivity type impurity region; forming a second conductivity type impurity region in an ultra-shallow portion of each of a source region and a drain region; forming a second conductivity type impurity region having a low density under the second conductivity type impurity region in the ultra-shallow portion; forming a second conductivity type impurity region having the same density as the second conductivity type impurity region in the ultra-shallow portion under the second conductivity type impurity region having the lower density and above the embedded insulating film; forming an insulating film on the source region, the drain region, and the gate electrode; dry etching the insulating film formed on the source region, the drain region and the gate electrode so as to form a sidewall around the gate electrode; forming a second conductivity type impurity region in each of the source region and the drain region; forming an interlayer insulating film and forming contact holes in the source region, the drain region, and the gate electrode; and forming a wiring on the interlayer insulating film.

As a result, in the transistor formed on the semiconductor film, a depletion layer generated by a difference in electric potential between a drain and a body can be extended toward the body side in a portion of the drain region having a high density, whereas the depletion layer can be actively extended toward the drain side in a portion of the drain region having a low density. Therefore, the electric potential concentration can be reduced in the vicinity of the body surface of the proximity of the drain and in the vicinity of the embedded insulating film, thereby reducing the generation of impact ions.

Further, the SOI transistor has a disadvantage in that a method of pulling holes generated by impact ionization out from a body terminal halves the area reduction effect. However, since the generation of impact ions themselves is reduced without providing a body terminal in the SOI transistor according to the present invention, the SOI transistor according to the present invention is effective to realize the area reduction effect which is an advantage of the SOI device.

Further, according to the present invention, there is provided a method of manufacturing a semiconductor integrated circuit, in which a CMOS transistor is formed on a first conductivity type semiconductor film provided on a first conductivity type supporting substrate through an embedded insulating film, including the steps of: conducting thermal oxidation so as to reach the embedded insulating film to form a LOCOS for element separation between transistors; forming a gate oxide film of a first conductivity type transistor; forming a first conductivity type impurity region reaching the embedded insulating film on the semiconductor film in a region where the first conductivity type transistor is to be formed; forming a polysilicon film serving as a gate electrode of the first conductivity type transistor so as to form a second conductivity type impurity region; forming a second conductivity type impurity region in an ultra-shallow portion of each of a source region and a drain region; forming a second conductivity type impurity region having a low density under the second conductivity type impurity region in the ultra-shallow portion; forming a second conductivity type impurity region having the same density as the second conductivity type impurity region in the ultra-shallow portion under the second conductivity type impurity region having the low density and above the embedded insulating film; providing a mask on the gate electrode and a part of the source region and the drain region so as to form a second conductivity type impurity region in each of the source region and the drain region; forming an interlayer insulating film and forming contact holes in the source region, the drain region, and the gate electrode; and forming a wiring on the interlayer insulating film. In a transistor formed by the above-mentioned method, a width of the portion of the drain region having a low density in a channel length direction is affected by a width of the mask. Therefore, a width in a channel length direction can be more easily controlled as compared with the case where a sidewall is provided around the gate electrode and a portion having a low density is formed in the drain region. As a result, the extension of the depletion layer in the proximity of the drain can be adjusted so as to be uniform. Accordingly, the impact ionization can be reduced in the vicinity of the body surface in the proximity of the drain or in the vicinity of the embedded insulating film.

Furthermore, according to the present invention, there is provided a method of manufacturing a semiconductor integrated circuit, in which a CMOS transistor is formed on a first conductivity type semiconductor film provided on a first conductivity type supporting substrate through an embedded insulating film, including the steps of: conducting thermal oxidation so as to reach the embedded insulating film to form a LOCOS for element separation between transistors; forming a gate oxide film of a first conductivity type transistor; forming a first conductivity type impurity region reaching the embedded insulating film on the semiconductor film in a region where the first conductivity type transistor is to be formed; forming a first conductivity type impurity region having a higher density than that of the first conductivity type impurity region in a portion of the semiconductor film serving as the proximal region to a drain in the first conductivity type impurity region; forming a polysilicon film serving as a gate electrode of the first conductivity type transistor and forming a second conductivity type impurity region; forming a second conductivity type impurity region in each of the source region and the drain region; forming an interlayer insulating film and forming contact holes in the source region, the drain region, and the gate electrode; and forming a wiring on the interlayer insulating film. In a transistor formed by the above-mentioned method, the depletion layer is extended toward the body side in the portion having a low density of the first conductivity type impurity region in the proximity of the drain while being extended toward the drain side in the portion having a high density so as to allow the uniformization of the extension of the depletion layer in the proximity of the drain. As a result, the generation of impact ions can be reduced.

DESCRIPTION OF THE PREFERRED EMBODIMENTS

Hereinafter, a first embodiment of the present invention will be described based on FIGS. 1A to 1F and FIGS. 2A to 2F.

In a method of manufacturing a semiconductor integrated circuit described in the first embodiment of the present invention, a method of manufacturing an N-type transistor and a P-type transistor in a P-type semiconductor film formed on a P-type supporting substrate through an embedded insulating film will be described. The same principle can be applied to a method of forming a transistor in an N-type semiconductor film formed on an N-type supporting substrate through an embedded insulating film. More specifically, two cases are conceived: the case where a first conductivity type is P-type and a second conductivity type is N-type; and the case where a first conductivity type is N-type and a second conductive type is P-type.

Although only an embodiment for an N-type SOI transistor where the first conductivity type is N-type is described, a P-type SOI transistor formed on the same N-type supporting substrate can be formed by the same method as that for the N-type transistor so as to provide the completely reversed conductivity.

Hereinafter, a method of manufacturing a semiconductor integrated circuit according to the present invention will be described.

Figure 1A:
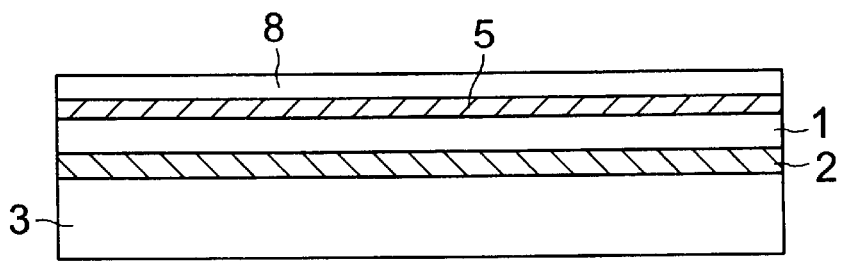
FIGS. 1A to 1F are process flow diagrams (1) showing a first manufacturing method of the present invention.

As shown in FIG. 1A, an SOI wafer having a semiconductor film 1 provided on a supporting substrate 3 through an embedded insulating film 2 is thermally oxidized so as to form a thermal oxide film 5 having a thickness of several hundreds of nm. A nitride film 8 is formed thereon to a thickness of about 1600 nm. Next, a LOCOS 11 is formed. First, alignment and exposure to light are performed for patterning of the LOCOS 11.

Figure 1B:
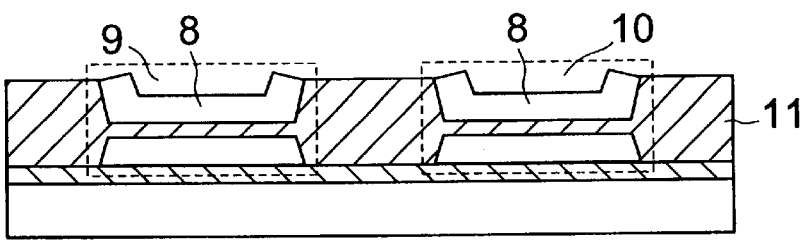

Next, the nitride film 8 is etched to form an opening in a LOCOS formation region. The SOI wafer in this state is placed in a thermal oxidation oven so as to form the LOCOS 11 for element isolation between a P-type transistor formation region 9 and an N-type transistor formation region 10. The LOCOS 11 is formed to have such a thickness that the LOCOS 11 reaches the embedded insulating film 2 overlying the supporting substrate 3. FIG. 1B shows a state where a mask of the thermal oxide film 5 and the nitride film 8 is formed in the P-type transistor formation region 9 and the N-type transistor formation region 10. After formation of the LOCOS 11, the nitride film 8 is removed. Then, all the oxide film other than the LOCOS 11 region is removed so as to conduct a gate oxidation process.

Figure 1C:
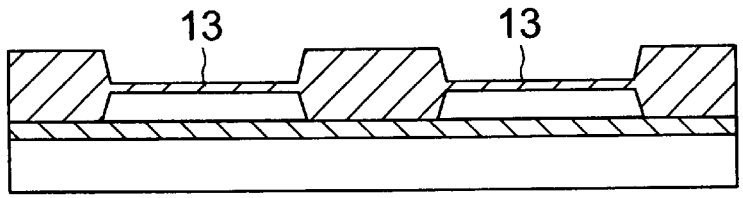

FIG. 1C shows a state where all the oxide film other than the LOCOS 11 is removed.

Figure 1D:
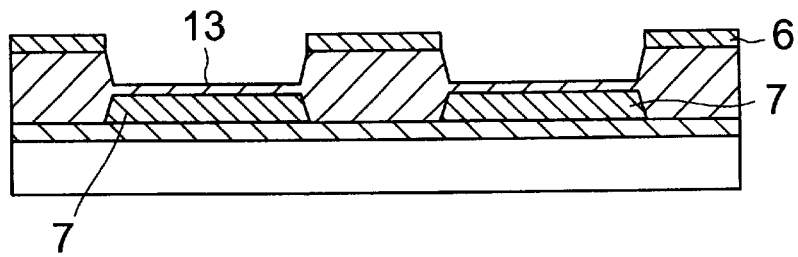

Furthermore, FIG. 1D shows a state after conducting the gate oxidation process. The patterning is conducted on a gate oxide film 13 by using a resist 6 so as to form an opening for ion implantation to a well 7. Next, as shown in FIG. 1D, ion implantation is performed through the gate oxide film 13, using the resist 6 as a mask. As a result, ions are implanted only in the opening formed through the resist 6. At this point, the energy for ion implantation is adjusted so as to have a peak of a density distribution in the semiconductor film 1.

Figure 1E:
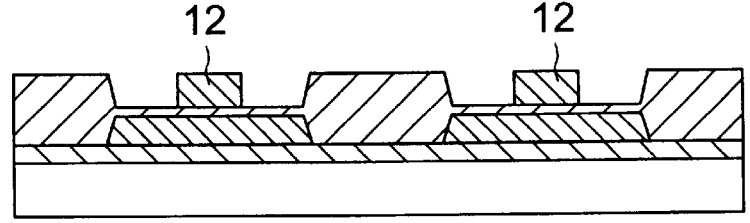

Next, as shown in FIG. 1E, after formation of a polysilicon film, alignment and exposure to light are performed for patterning of a gate electrode 12. Next, the polysilicon film is etched by dry etching so as to form the gate electrode 12.

Figure 1F:
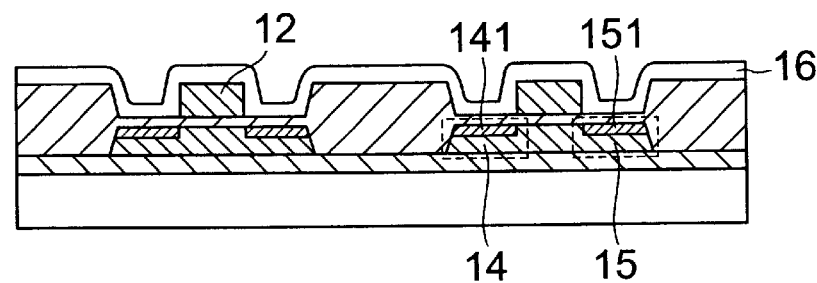

Next, as shown in FIG. 1F, an insulating film 16 having a thickness of about several hundreds of angstrom is formed on an N-type transistor source region 14, an N-type transistor drain region 15 and the gate electrode 12. In order to conduct shallow ion implantation, for example, an ultra-shallow high-density N-type source region 141 and an ultra-shallow high density N-type drain region 151 having a density of about $1E18/cm^3$ are formed at the energy of about 40 KeV.

Figure 2A:
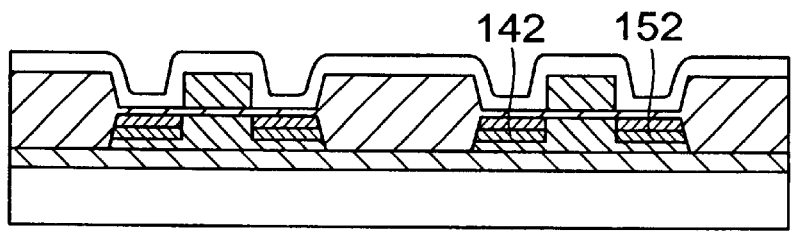
FIGS. 2A to 2F are process flow diagrams (2) showing the first manufacturing method of the present invention.

Next, as shown in FIG. 2A, for ion implantation to a depth around the middle portion in the drain region 14 and the source region 15, for example, a low-density N-type source region 142 and a low-density N-type drain region 152 having a density of about $1E17/cm^3$ are formed at the energy of about 60 KeV.

Figure 2B:
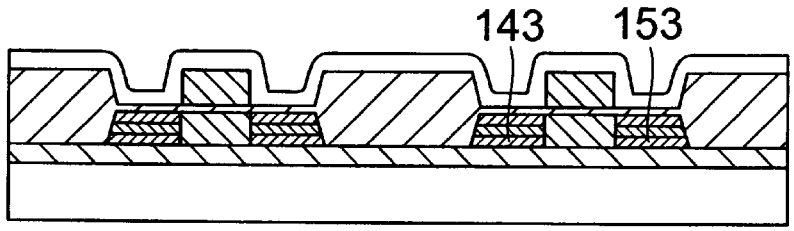
Figure 2C:
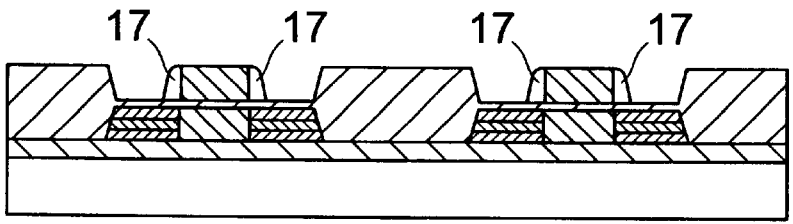

Furthermore, as shown in FIG. 2B, in order to conduct deep ion implantation, for example, an embedded insulating film neighboring high-density N-type source region 143 and an embedded insulating film neighboring drain region 153 having a density of about $1E1/cm^3$ are formed at the energy of about 100 KeV. Next, as shown in FIG. 2C, the insulating film 16 overlying the source/drain regions and the gate electrodes is dry etched so as to form a sidewall 17 around the gate electrode 12. The sidewall 17 serves as an implantation mask when the implantation to the source and the drain is conducted in the later process.

Figure 2D:
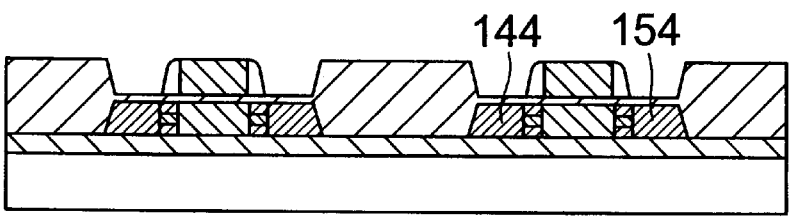
Figure 2E:
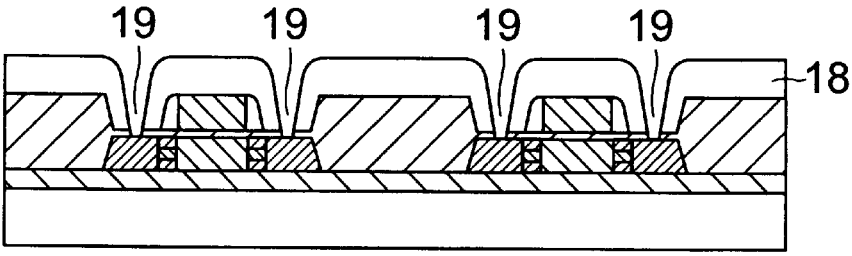

Next, as shown in FIG. 2D, a high-density N-type source region 144 and a high-density N-type drain region 154 having a density of about $1E18/cm^3$ are formed in the source region and the drain region at the energy of about 60 KeV. By this implantation, the N-type impurity regions where only a part of the source region and the drain region has a low density can be formed. From there on, the same steps as those of a normal CMOS manufacturing process are conducted. As shown in FIG. 2E, an interlayer insulating film 18 is formed. Then, contacts 19 in the source/drain regions of the transistor are formed.

Figure 2F:
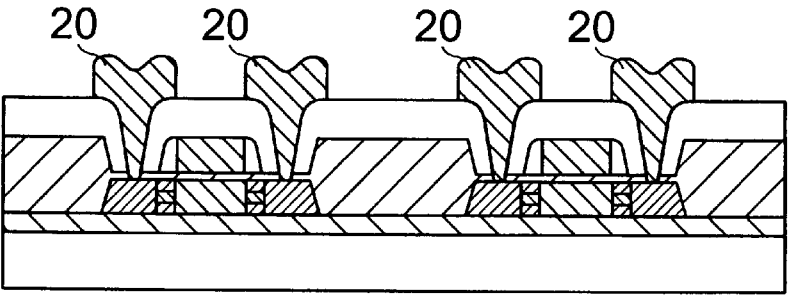

Next, as shown in FIG. 2F, a metal film is formed, and a resist is applied thereon. The alignment and the exposure to light are conducted for patterning and etching of a wiring. Thereafter, a protective film is formed on the wiring. A bonding pad is formed to complete a semiconductor integrated circuit.

Figure 3A:
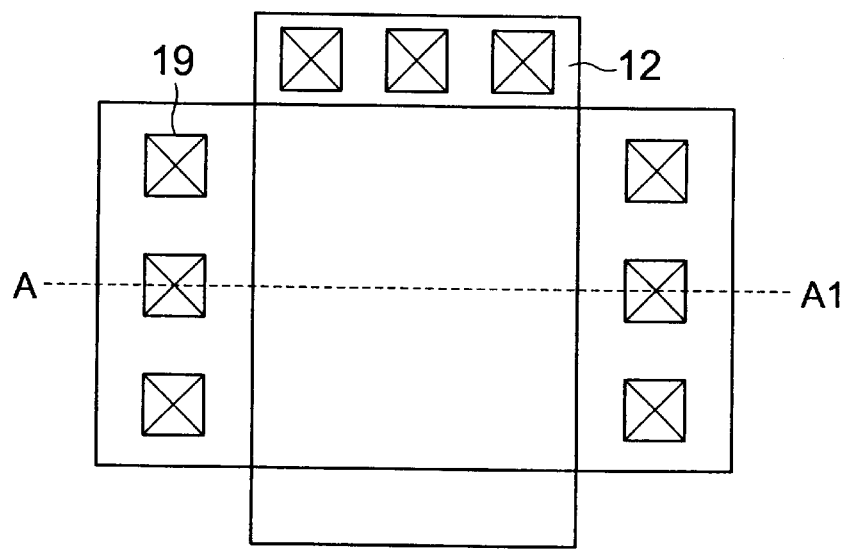
FIGS. 3A and 3B are a top view and a cross-sectional view showing a structure of the transistor of the first manufacturing method of the present invention.
Figure 3B:
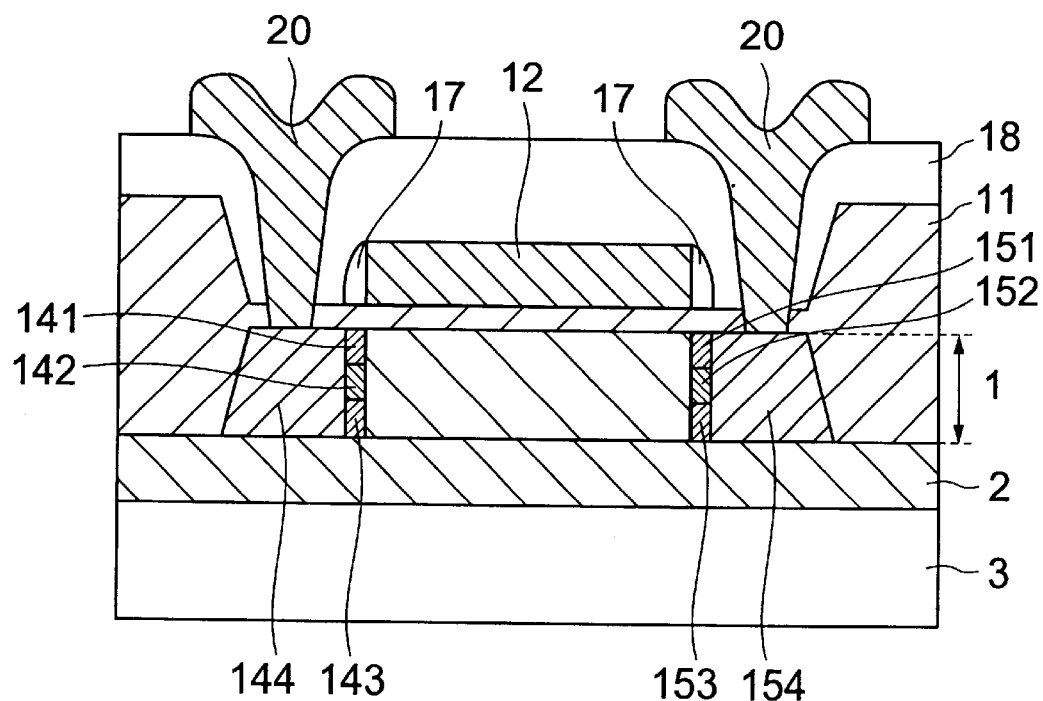
Figure 4A:
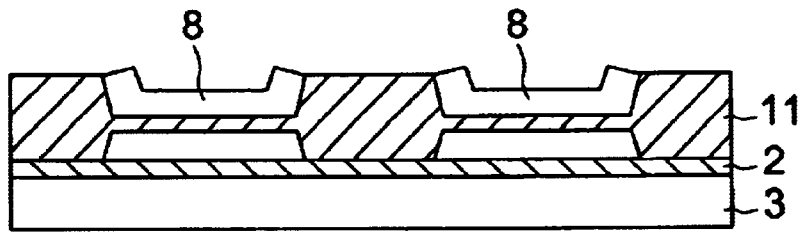
FIGS. 4A to 4D are process flow diagrams showing a conventional manufacturing method.
Figure 4B:
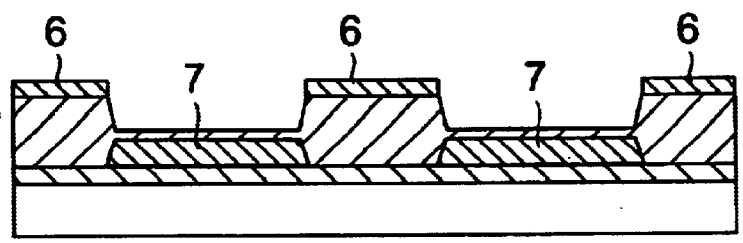
Figure 4C:
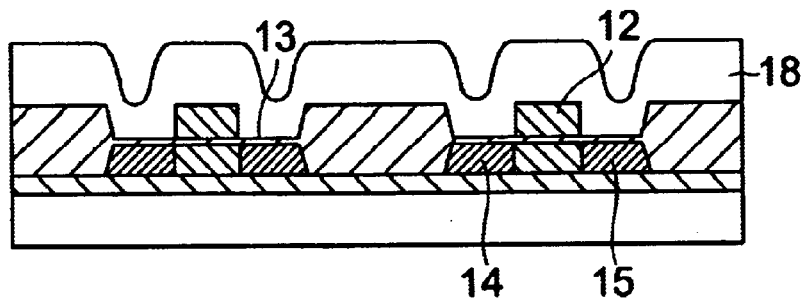
Figure 4D:
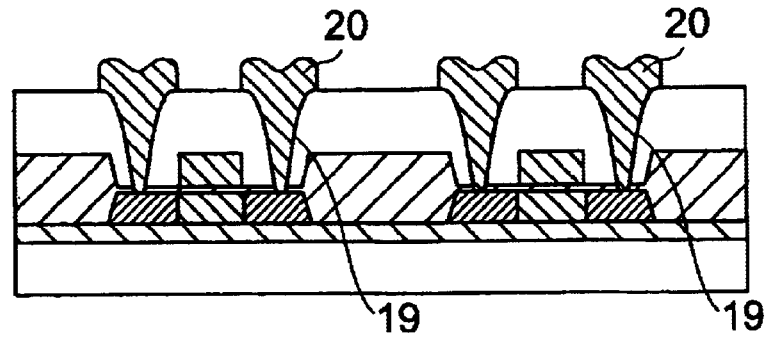
Figure 5A:
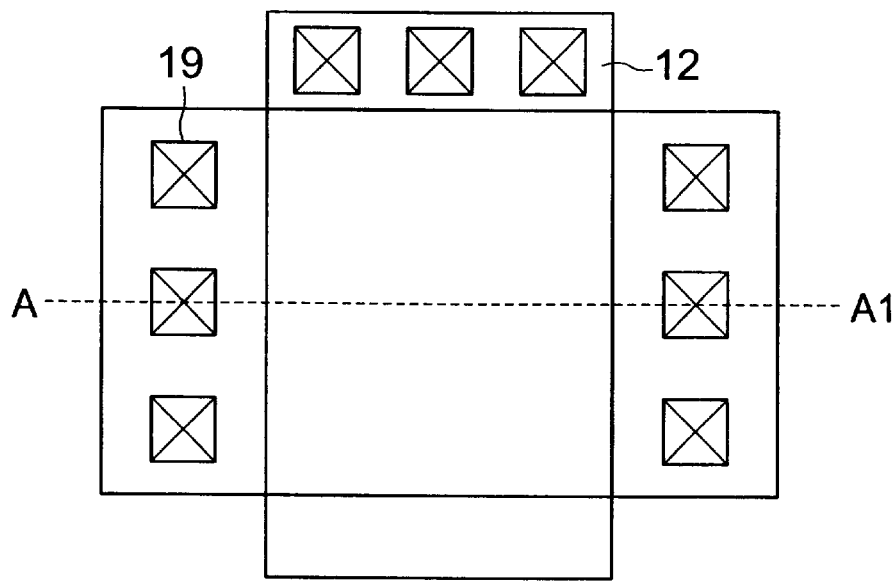
FIGS. 5A and 5B are a top view and a cross-sectional view showing a structure of the transistor of the conventional manufacturing method.
Figure 5B:
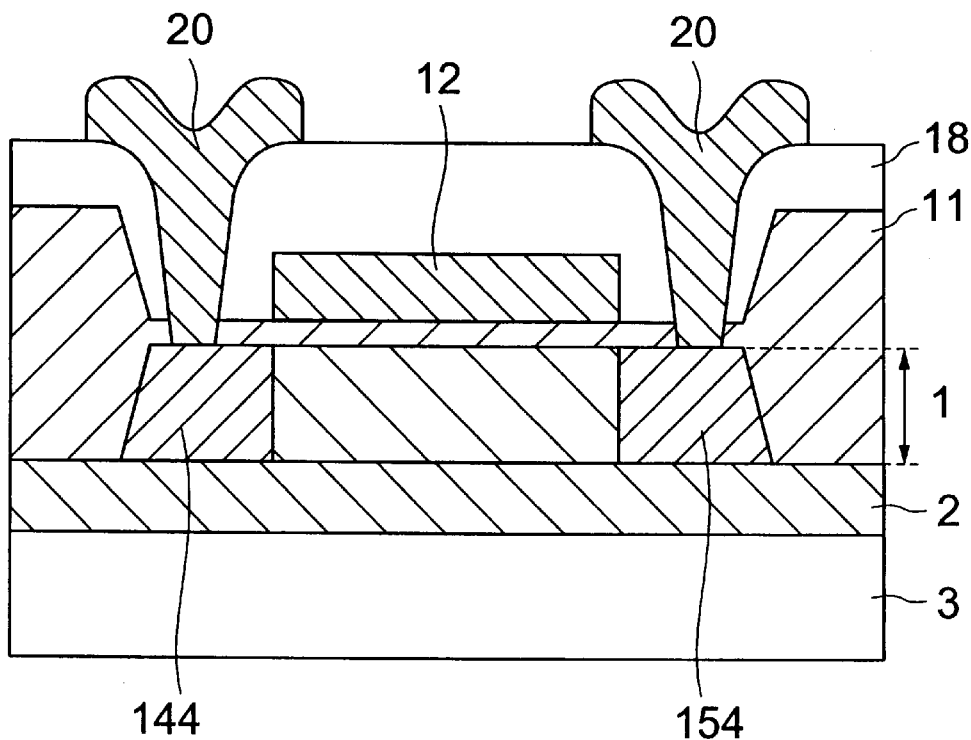
Figure 6:
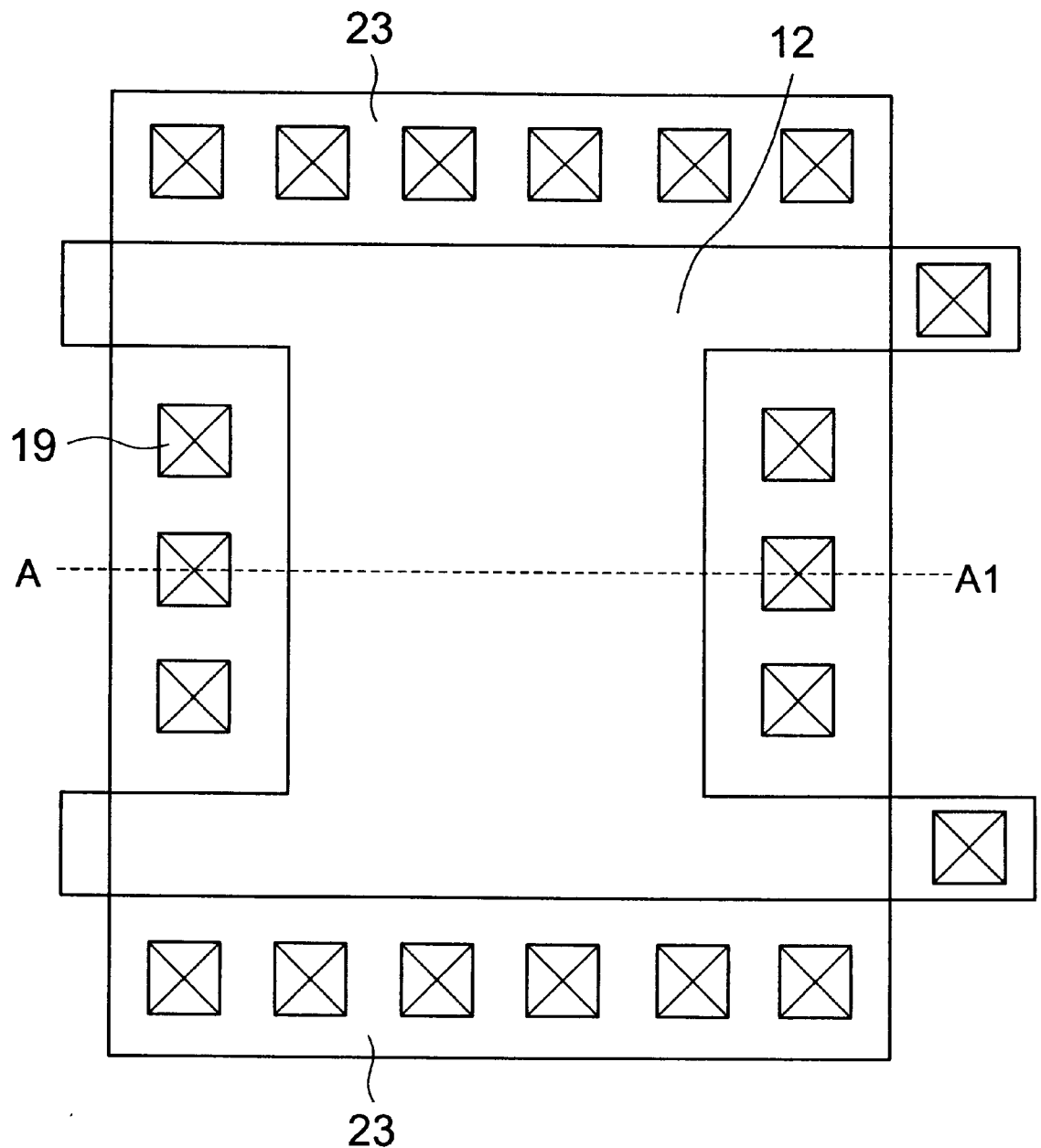
FIG. 6 is a top view showing a hole pull-out method of the conventional manufacturing method.

FIGS. 3A and 3B are a top view and a cross-sectional view showing a structure of a transistor according to a first manufacturing method of the present invention. FIG. 3B is a cross-sectional view, cut along a line A–A1 in the top view of FIG. 3A. Since the same reference numerals as those in FIGS. 1A to FIG. 2F are used in FIGS. 3A and 3B, the description thereof is omitted herein. As shown in FIGS. 3A and 3B, since a depletion layer in the proximity of the drain of the transistor formed can be actively extended toward the drain side, that is, toward the N-type drain low-density region 152 side in the vicinity of the middle of the semiconductor film 1, the extension of the depletion layer toward the body side can be restrained. Thus, a width of the depletion layer in a channel length direction scarcely differs in the vicinity of the body surface in the proximity of the drain and the vicinity of the embedded insulating film 2. As a result, the electric field density in the vicinity of the body surface or the vicinity of the embedded insulating film 2 can be restrained. Therefore, the generation of the impact ions can be reduced.

Furthermore, the SOI transistor has a disadvantage in that the area reduction effect is halved in the case where a method of providing a body terminal and pulling holes generated by the impact ionization out from the body terminal is employed. On the other hand, the SOI transistor according to the present invention has the effect of reducing the generation of impact ions themselves without providing a body terminal and losing the area reduction effect which is the advantage of the SOI device.

Next, a second embodiment of the present invention will be described based on FIGS. 7A to 7F and FIGS. 8A to 8F.

Hereinafter, a method of manufacturing a semiconductor integrated circuit according to the present invention will be described.

Figure 7A:
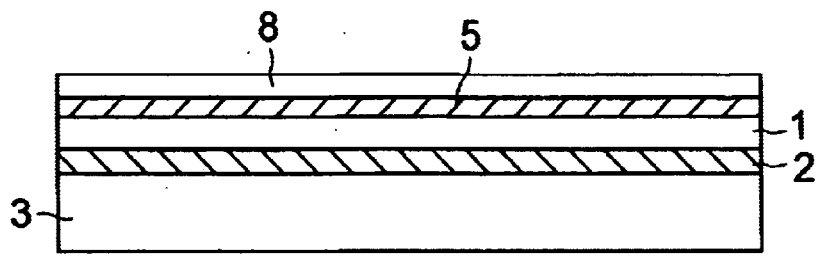
FIGS. 7A to 7F are process flow diagrams (1) showing a second manufacturing method of the present invention.

As shown in FIG. 7A, an SOI wafer having the semiconductor film 1 provided on the supporting substrate 3 through the embedded insulating film 2 is thermally oxidized so as to form the thermal oxide film 5 having a thickness of several hundreds of nm. The nitride film 8 is formed thereon to a thickness of about 1600 nm.

Figure 7B:
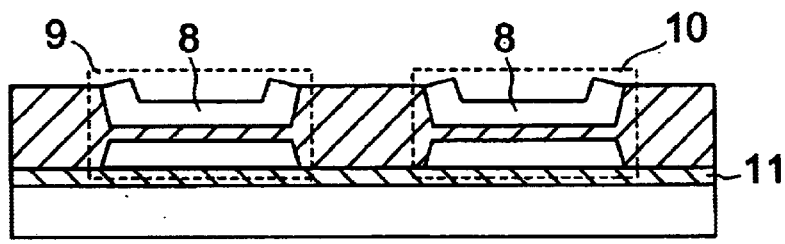

Next, the LOCOS 11 is formed. First, alignment and exposure to light are performed for patterning of the LOCOS 11. Next, the nitride film 8 is etched to form the opening in the LOCOS formation region. The SOI wafer in this state is placed in a thermal oxidation oven so as to form the LOCOS 11. The LOCOS 11 is formed to have such a thickness that the LOCOS 11 reaches the embedded insulating film 2 overlying the supporting substrate 3. FIG. 7B shows a state where a mask of the thermal oxide film 5 and the nitride film 8 is formed in the P-type transistor formation region 9 and the N-type transistor formation region 10. After formation of the LOCOS 11, the nitride film 8 is removed. Then, all the oxide film other than the LOCOS 11 is removed so as to conduct a gate oxidation process.

Figure 7C:
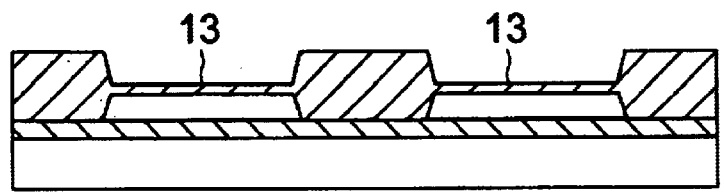

FIG. 7C shows a state where all the oxide film other than the LOCOS 11 is removed.

Figure 7D:
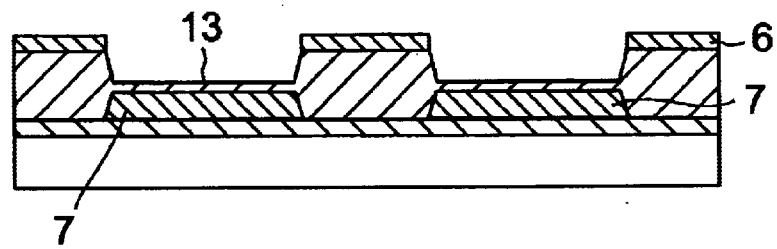

Furthermore, FIG. 7D shows a state after conducting the gate oxidation process. The patterning is conducted on the gate oxide film 13 by using the resist 6 so as to form an opening for ion implantation to the well 7. Next, as shown in FIG. 7D, ion implantation is performed through the gate oxide film 13, using the resist 6 as a mask. As a result, ions are implanted only in the opening formed through the resist 6. At this point, the energy for ion implantation is adjusted so as to have a peak of a density distribution in the semiconductor film 1.

Figure 7E:
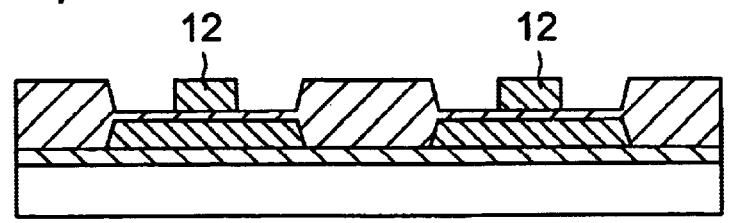

Next, as shown in FIG. 7E, after formation of the polysilicon film, alignment and exposure to light are performed for patterning of the gate electrode 12. Next, the polysilicon film is etched by dry etching so as to form the gate electrode 12.

Figure 7F:
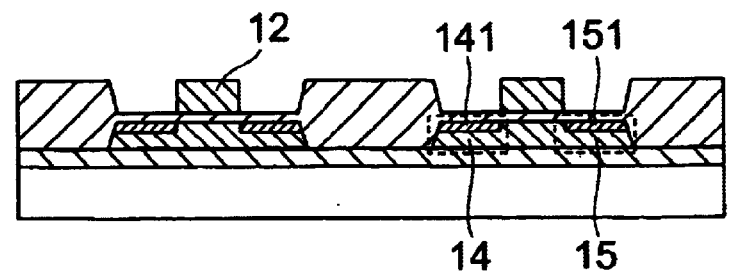

Furthermore, as shown in FIG. 7F, in order to conduct shallow ion implantation, for example, the ultra-shallow high-density N-type source region 141 and the ultra-shallow high-density N-type drain region 151 having a density of about $1E18/cm^3$ are formed at the energy of about 40 KeV.

Figure 8A:
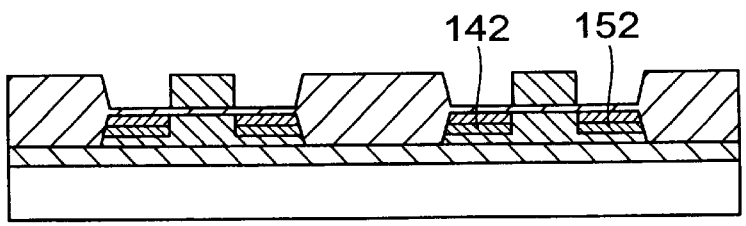
FIGS. 8A to 8F are process flow diagrams (2) showing the second manufacturing method of the present invention.

Next, as shown in FIG. 8A, for ion implantation to a depth around the middle portion in the drain region 14 and the source region 15, for example, the low-density N-type source region 142 and the low-density N-type drain region 152 having a density of about $1E17/cm^3$ are formed at the energy of about 60 KeV.

Figure 8B:
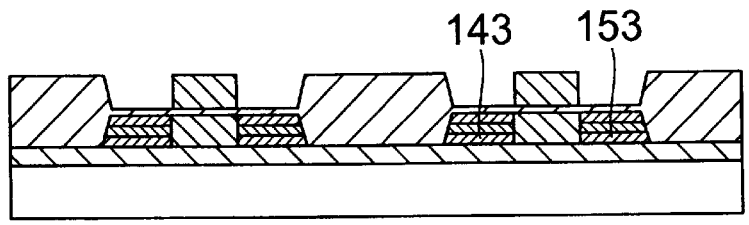
Figure 8C:
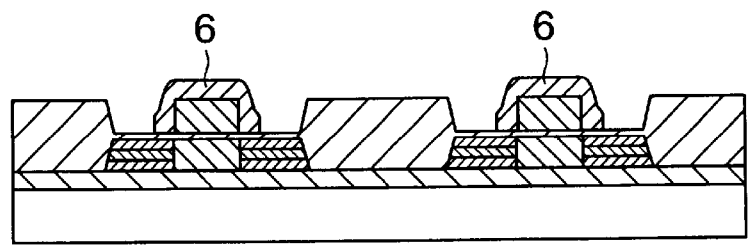

Furthermore, as shown in FIG. 8B, in order to conduct deep ion implantation, for example, the embedded insulating film neighboring high-density N-type source region 143 and the embedded insulating neighboring drain region 153 having a density of about $1E18/cm^3$ are formed at the energy of about 100 KeV. Next, unlike the first embodiment, the resist 6 is applied onto the gate electrode 12, the source region 14 and the drain region 15 as shown in FIG. 8C in this second embodiment. The alignment and the exposure to light are conducted to form a mask on the gate electrode 12, and a part of the source region 14 and the drain region 15.

Figure 8D:
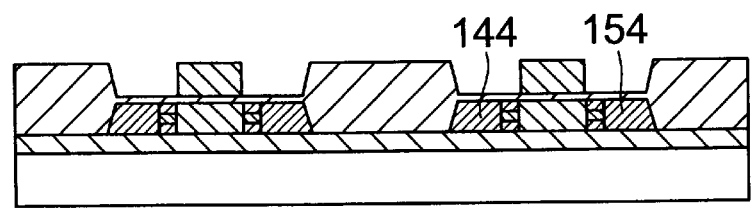

Then, as shown in FIG. 8D, the high-density N-type source region 144 and the high-density N-type drain region 154 having a density of about $1E18/cm^3$ are formed in the source region and the drain region at the energy of about 60 KeV. By this implantation, the N-type impurity regions where only a part of the source region and the drain region has a low density can be formed.

Figure 8E:
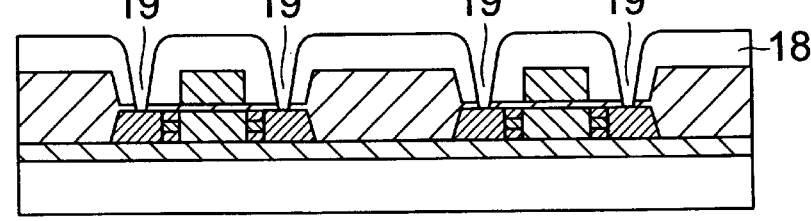
Figure 8F:
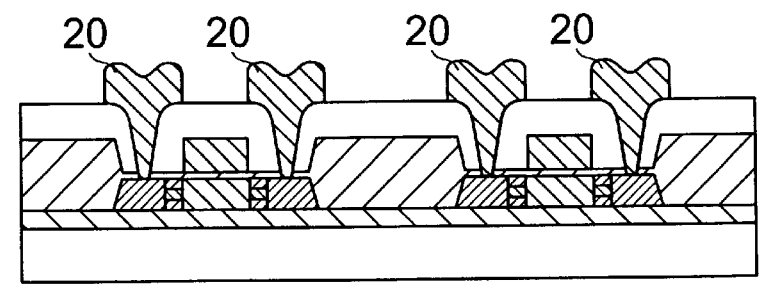

From there on, the same steps as those of a normal CMOS manufacturing process are conducted as in the first embodiment. As shown in FIG. 8E, the interlayer insulating film 18 is formed. Then, the contacts 19 in the source/drain regions of the transistor are formed. Next, as shown in FIG. 8F, a metal film is formed, and a resist is applied thereon. The alignment and the exposure to light are conducted for patterning and etching of the wiring 20. Thereafter, a protective film is formed on the wiring 20. A bonding pad is formed to complete a semiconductor integrated circuit.

Figure 9A:
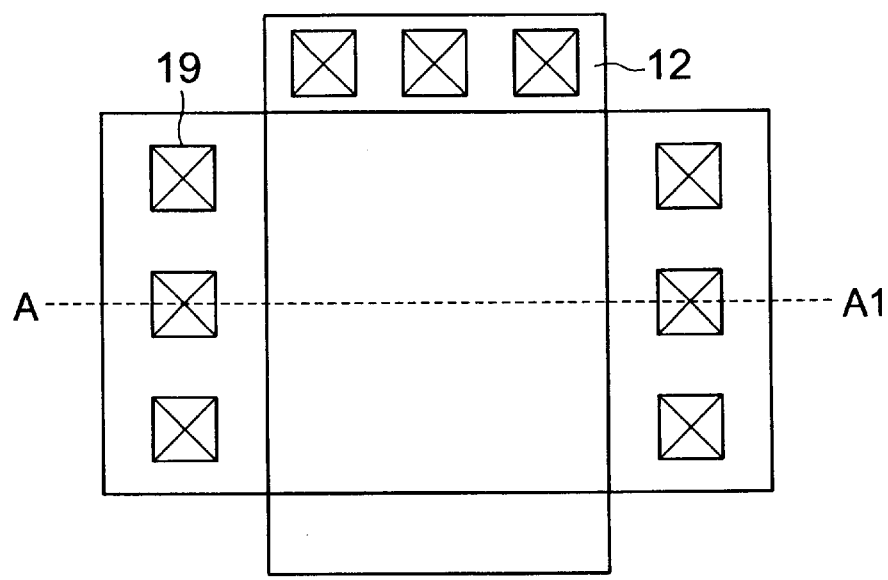
FIGS. 9A and 9B are a top view and a cross-sectional view showing a structure of the transistor of the second manufacturing method of the present invention.
Figure 9B:
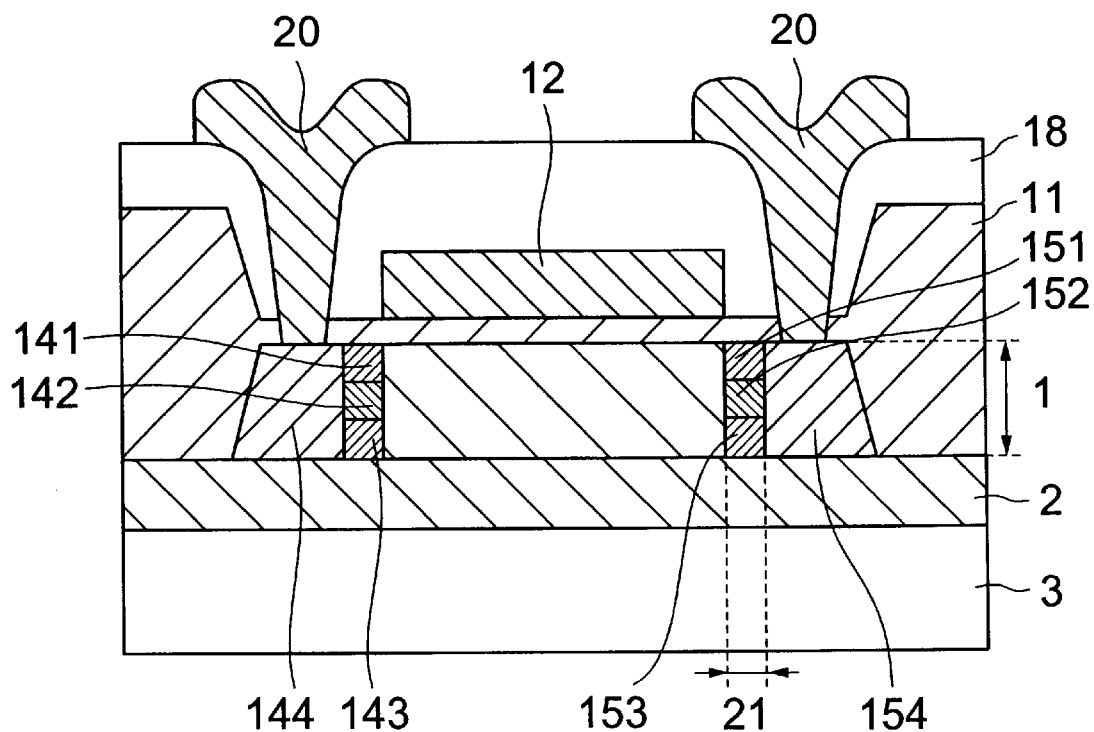

FIGS. 9A and 9B are a top view and a cross-sectional view showing a structure of a transistor according to the second manufacturing method of the present invention. FIG. 9B is a cross-sectional view, cut along a line A–A1 in the top view of FIG. 9A. Since the same reference numerals as those in FIGS. 7A to FIG. 8F are used in FIGS. 9A and 9B, the description thereof is omitted herein. As shown in FIGS. 9A and 9B, since a depletion layer in the proximity of the drain of the transistor formed can be actively extended toward the drain side, that is, toward the N-type drain low-density region 152 side in the vicinity of the middle of the semiconductor film 1, the extension of the depletion layer toward the body side can be restrained. Thus, a width of the depletion layer in a channel length direction scarcely differs in the vicinity of the body surface in the proximity of the drain and the vicinity of the embedded insulating film 2. As a result, the electric field density in the vicinity of the body surface or the vicinity of the embedded insulating film 2 can be restrained. Therefore, the generation of the impact ions can be reduced.

In the case where the sidewall 17 is provided around the gate electrode 12 so as to serve as a mask upon implantation to the source region 14 and the drain region 15 in the embodiment 1, a width of the N-type drain low-density region is about 0.1 micron. On the other hand, in this second embodiment, high-density implantation to the source region 14 and the drain region 15 is performed by providing a mask on the gate electrode 12 and a part of the source region 14 and the drain region 15. Therefore, since a width 21 of the N-type drain low-density region can be adjusted by a width of the mask, the extension of the deletion layer toward the body side can be uniformized from the vicinity of the body surface to the vicinity of the embedded insulating film.

Figure 10A:
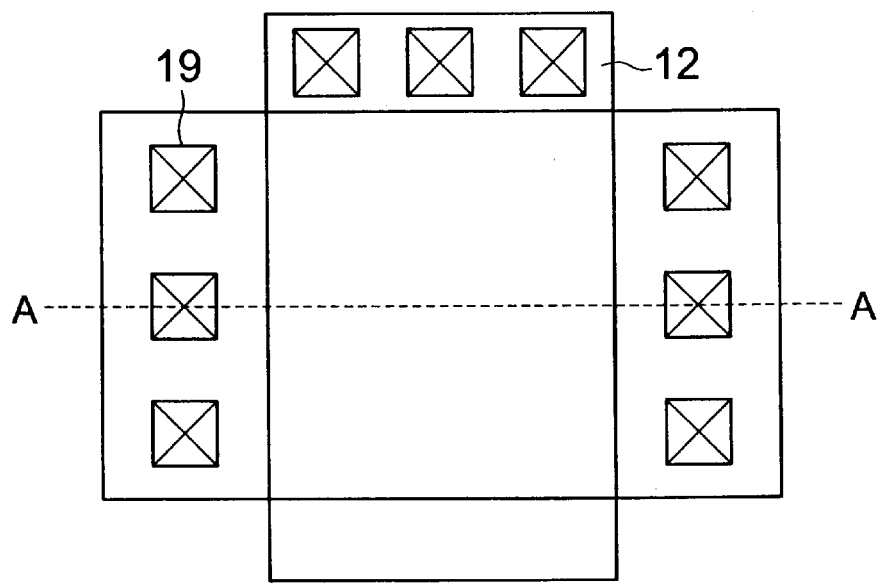
FIGS. 10A and 10B are a top view and a cross-sectional view showing a structure of a second transistor of the second manufacturing method of the present invention.
Figure 10B:
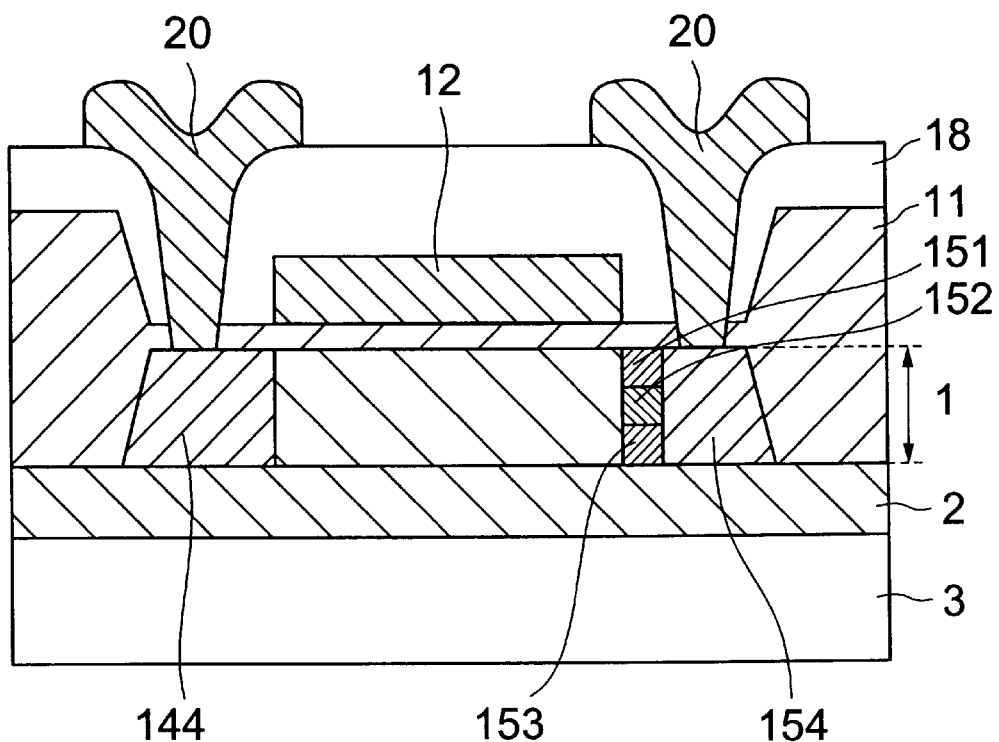

The N-type low density region is required only for the drain side and is not needed for the source side where impact ions are not generated. FIGS. 10A and 10B are a top view and a cross-sectional view showing a structure of a second transistor according to the second manufacturing method of the present invention. In the case where high-density implantation to the source region 14 and the drain region 15 is performed with a mask being provided on the gate region 12, and a part of the source region 14 and the drain region 15, an N-type low-density region can be provided only on the drain side as shown in FIG. 10B.

Next, a third embodiment of the present invention will be described based on FIGS. 11A to 11F and FIGS. 12A to 12C. Hereinafter, a method of manufacturing a semiconductor integrated circuit according to the present invention will be described.

Figure 11A:
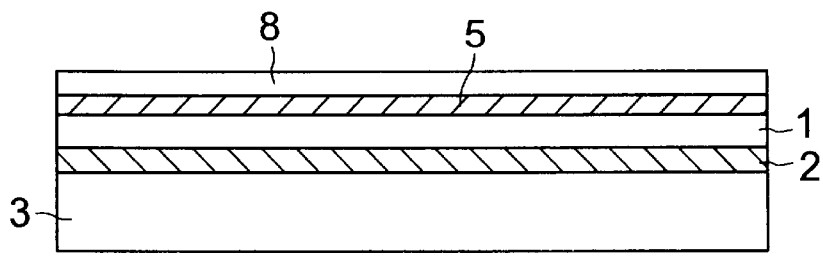
FIGS. 11A to 11F are process flow diagrams (1) showing a third manufacturing method of the present invention.
Figure 11B:
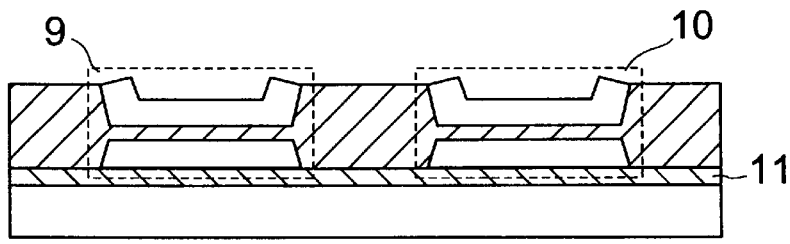
Figure 11C:
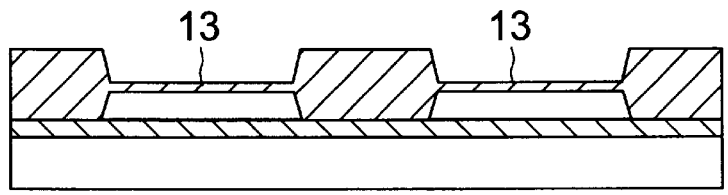

As shown in FIG. 11B, the LOCOS 11 is formed in an SOI wafer having the semiconductor film 1 provided on the supporting substrate 3 through the embedded insulating film 2. First, the thermal oxide film 5 is formed to a thickness of several hundreds of angstrom. The nitride film 8 is formed thereon to a thickness of about 1600 angstrom. Next, alignment and exposure to light are performed for patterning of the LOCOS 11. Then, the nitride film 8 is etched to form the opening in the LOCOS formation region. FIG. 11A shows a state where a mask of the thermal oxide film 5 and the nitride film 8 is formed on the P-type transistor region 9 and the N-type transistor region 10. The SOI wafer in this state is placed in a thermal oxidation oven so as to form the LOCOS 11 for element separation between the P-type transistor formation region 9 and the N-type transistor formation region 10 as shown in FIG. 11B. The LOCOS 11 is formed to have such a thickness that the LOCOS 11 reaches the embedded insulating film 2 overlying the supporting substrate 3. After formation of the LOCOS 11, the nitride film 8 is removed. Then, all the oxide film other than the LOCOS 11 is removed so as to conduct a gate oxidation process to form the gate oxide film 13 (FIG. 11C).

Figure 11D:
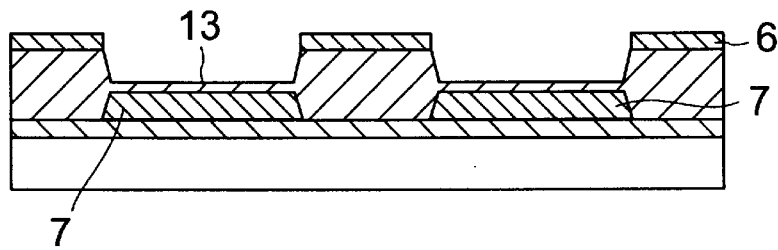
Figure 11E:
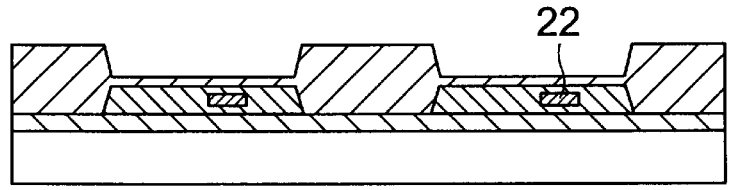

Then, the patterning is conducted by using the resist 6 formed on the gate oxide film 13 so as to form an opening for ion implantation to the well 7. Next, as shown in FIG. 11D, ion implantation is performed through the gate oxide film 13, using the resist 6 as a mask. As a result, ions are implanted only in the opening formed through the resist 6. At this point, the energy for ion implantation is adjusted so as to have a peak of a density distribution in the semiconductor film 1.

Next, the ion implantation is performed through the mask having an opening in the region corresponding to the proximity of the drain in the well, so that the P-type impurity region 22 having a higher density than the well is formed at the middle depth of the semiconductor film by photolithography and ion implantation.

Figure 11F:
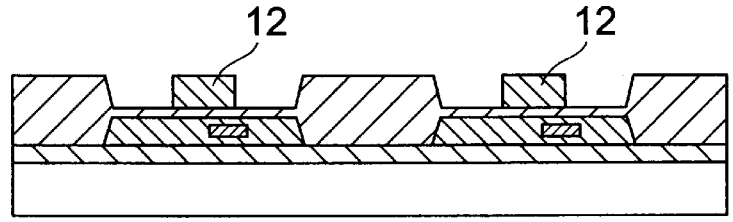
Figure 12A:
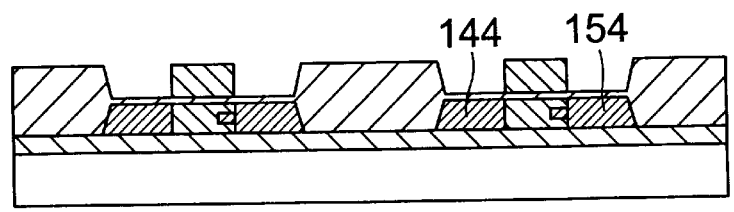
FIGS. 12A to 12C are process flow diagrams (2) showing the third manufacturing method of the present invention.
Figure 12B:
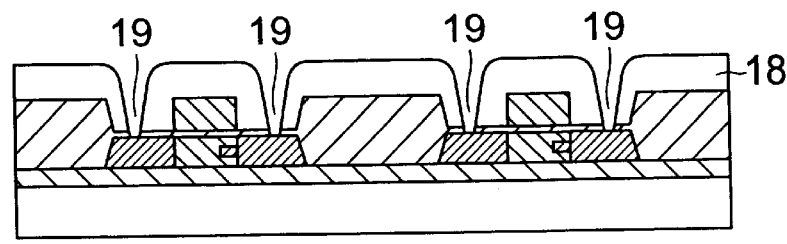
Figure 12C:
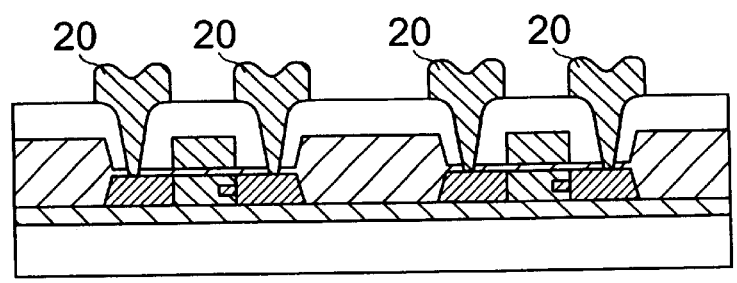

Furthermore, after formation of a polysilicon film, the alignment and exposure to light are conducted for patterning of the gate electrode 12 as shown in FIG. 11F. Next, the polysilicon film is etched by dry etching to form the gate electrode 12. Next, as shown in FIG. 12A, the high-density N-type source region 144 and the high-density N-type drain region 154 having a density of about $1E18/cm^3$ are formed in the source region and the drain region at the energy of about 60 KeV. From there on, the same steps as those of a normal CMOS manufacturing process are conducted as in the first embodiment. As shown in FIG. 12B, the interlayer insulating film 18 is formed. Then, the contacts 19 in the source/drain regions of the transistor are formed. Next, as shown in FIG. 12C, a metal film is formed, and a resist is applied thereon. The alignment and the exposure to light are conducted for patterning and etching of the wiring 20. Thereafter, a protective film 19 is formed on the wiring 20. Furthermore, a bonding pad is formed to complete a semiconductor integrated circuit.

Figure 13A:
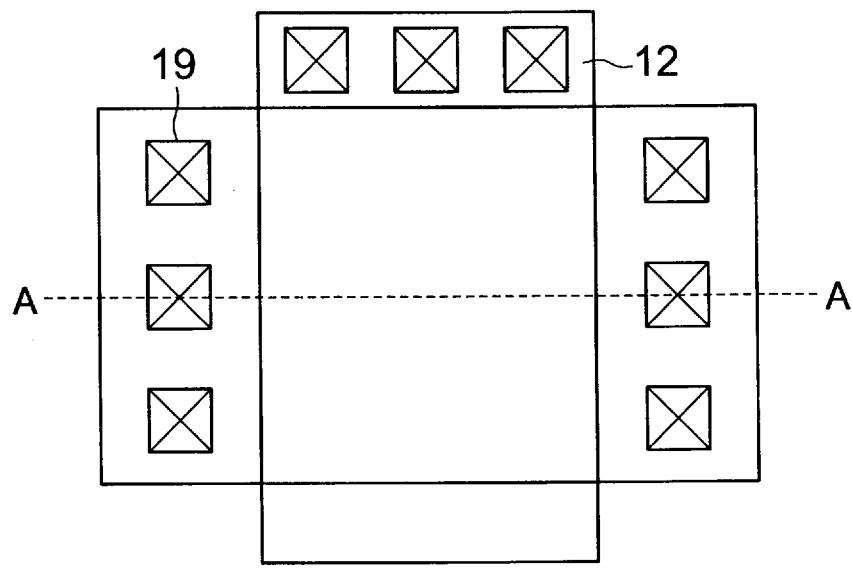
FIGS. 13A and 13B are a top view and a cross-sectional view showing a structure of the transistor of the third manufacturing method of the present invention.
Figure 13B:
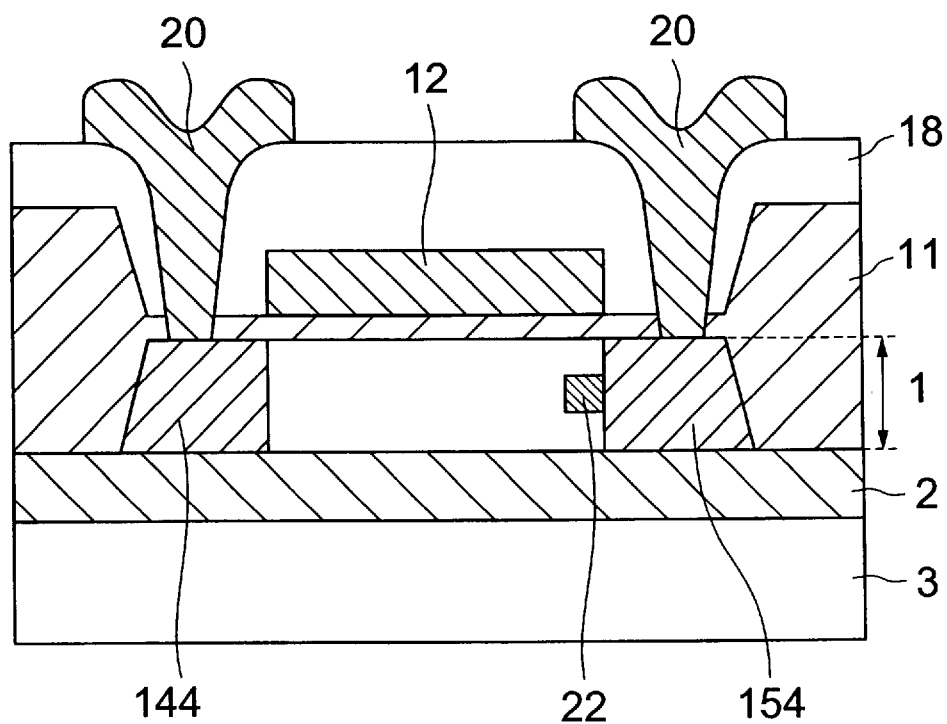

FIGS. 13A and 13B are a top view and a cross-sectional view showing a structure of a transistor according to a third manufacturing method of the present invention. FIG. 13B is a cross-sectional view, cut along a line A–A1 in the top view of FIG. 13A. Since the same reference numerals as those in FIGS. 11A to FIG. 12C are used in FIGS. 13A and 13B, the description thereof is omitted herein. As shown in FIGS. 13A and 13B, the depletion layer in the proximity of the drain of the transistor has a high body density in the vicinity of the middle of the semiconductor film 1.

Thus, the extension of the depletion layer toward the body side can be restrained. As a result, a width of the depletion layer in a channel length direction scarcely differs in the vicinity of the body surface in the proximity of the drain and the vicinity of the embedded insulating film 2. Therefore, the electric field density in the vicinity of the body surface or the vicinity of the embedded insulating film 2 can be restrained. Consequently, the generation of the impact ions can be reduced.

The present invention is carried out in the modes as described above and has the effects described as follows.

A method of manufacturing a semiconductor integrated circuit, in which a CMOS transistor is formed on a first conductivity type semiconductor film provided on a first conductivity type supporting substrate through an embedded insulating film, includes the steps of: conducting thermal oxidation so as to reach the embedded insulating film to form a LOCOS for element separation between transistors; forming a gate oxide film of a first conductivity type transistor; forming a first conductivity type impurity region reaching the embedded insulating film on the semiconductor film in a region where the first conductivity type transistor is to be formed; forming a polysilicon film serving as a gate electrode of the first conductivity type transistor so as to form a second conductivity type impurity region; forming a second conductivity type impurity region in an ultra-shallow portion of each of a source region and a drain region; forming a second conductivity type impurity region having a low density under the second conductivity type impurity region in the ultra-shallow portion; forming a second conductivity type impurity region having the same density as the second conductivity type impurity region in the ultra-shallow portion under the second conductivity type impurity region having the lower density and above the embedded insulating film; forming an insulating film on the source region, the drain region, and the gate electrode; dry etching the insulating film formed on the source region, the drain region, and the gate electrode so as to form a sidewall around the gate electrode; forming a second conductivity type impurity region in each of the source region and the drain region; forming an interlayer insulating film and forming contact holes in the source region, the drain region, and the gate electrode; and forming a wiring on the interlayer insulating film. As a result, in the transistor formed on the semiconductor film, a depletion layer generated by a difference in electric potential between a drain and a body can be extended toward the body side in the portion of the drain region having a high density whereas the depletion layer can be actively extended toward the drain side in the portion of the drain region having a low density. Therefore, the electric field density in the vicinity of the body surface of the proximity of the drain or the vicinity of the insulating film can be reduced to reduce the generation of impact ions. Furthermore, the SOI transistor conventionally has a disadvantage in that the use of a method of pulling holes generated by impact ionization out from a body terminal halves the area reduction effect. Since the generation of impact ions themselves is reduced without providing a body terminal in the SOI transistor according to the present invention, the SOI transistor according to the present invention is effective to realize the area reduction effect which is the advantage of the SOI device.

Furthermore, a method of manufacturing a semiconductor integrated circuit, in which a CMOS transistor is formed on a first conductivity type semiconductor film provided on a first conductivity type supporting substrate through an embedded insulating film, includes the steps of: conducting thermal oxidation so as to reach the embedded insulating film to form a LOCOS for element separation between transistors; forming a gate oxide film of a first conductivity type transistor; forming a first conductivity type impurity region reaching the embedded insulating film on the semiconductor film in a region where the first conductivity type transistor is to be formed; forming a polysilicon film serving as a gate electrode of the first conductivity type transistor so as to form a second conductivity type impurity region; forming a second conductivity type impurity region in an ultra-shallow portion of each of a source region and a drain region; forming a second conductivity type impurity region having a low density under the second conductivity type impurity region in the ultra-shallow portion; forming a second conductivity type impurity region having the same density as the second conductivity type impurity region in the ultra-shallow portion under the second conductivity type impurity region having the low density and above the embedded insulating film; providing a mask on the gate electrode and a part of the source region and the drain region so as to form a second conductivity type impurity region in each of the source region and the drain region; forming an interlayer insulating film and forming contact holes in the source region, the drain region, and the gate electrode; and forming a wiring on the interlayer insulating film. In a transistor formed by the above-mentioned method, a width of the portion of the drain region having a low density in a channel length direction is affected by a width of the mask. Therefore, a width in a channel length direction can be more easily controlled as compared with the case where a sidewall is provided around the gate electrode and a portion having a low density is formed in the drain region. As a result, the extension of the depletion layer in the proximity of the drain can be adjusted so as to be uniform. Accordingly, the impact ionization can be reduced in the vicinity of the body surface in the proximity of the drain or in the vicinity of the embedded insulating film.

Furthermore, a method of manufacturing a semiconductor integrated circuit, in which a CMOS transistor is formed on a first conductivity type semiconductor film provided on a first conductivity type supporting substrate through an embedded insulating film, includes the steps of: conducting thermal oxidation so as to reach the embedded insulating film to form a LOCOS for element separation between transistors; forming a gate oxide film of a first conductivity type transistor; forming a first conductivity type impurity region reaching the embedded insulating film on the semiconductor film in a region where the first conductivity type transistor is to be formed; forming a first conductivity type impurity region having a higher density than that of the first conductivity type impurity region in a portion of the semiconductor film serving as the proximal region to a drain in the first conductivity type impurity region; forming a polysilicon film serving as a gate electrode of the first conductivity type transistor and forming a second conductivity type impurity region; forming a second conductivity type impurity region in each of the source region and the drain region; forming an interlayer insulating film and forming contact holes in the source region, the drain region, and the gate electrode; and forming a wiring on the interlayer insulating film. In a transistor formed by the above-mentioned method, the depletion layer is extended toward the body side in the portion having a low density of the first conductivity type impurity region in the proximity of the drain while being extended toward the drain side in the portion having a high density so as to allow the uniformization of the extension of the depletion layer in the proximity of the drain. As a result, the generation of impact ions can be reduced.

What is claimed is:

1. A method of manufacturing a semiconductor integrated circuit, in which a CMOS transistor is formed on a first conductivity type semiconductor film provided on a first conductivity type supporting substrate through an embedded insulating film, comprising the steps of:

conducting thermal oxidation to form a LOCOS for element separation between transistors in the semiconductor film;

forming a gate oxide film of a first conductivity type transistor;

forming a first conductivity type impurity region between the gate oxide film and the embedded insulating film in a region where the first conductivity type transistor is to be formed;

forming a polysilicon film on the gate oxide film and etching the polysilicon film so as to form a gate electrode of the first conductivity type transistor;

forming a second conductivity type impurity region in an ultra-shallow portion of each of a source region and a drain region;

forming a second conductivity type impurity region having a low density in a middle portion of each of the source region and the drain region;

forming a second conductivity type impurity region having the same density as the second conductivity type impurity region in the ultra-shallow portion in a lower portion of each of the source region and the drain region;

forming an insulating film on the source region, the drain region, and the gate electrode;

dry etching the insulating film formed on the source region, the drain region, and the gate electrode to form a sidewall around the gate electrode; and performing ion implantation using the sidewall as a mask so as to form a second conductivity type impurity region in each of the source region and the drain region.

* * * * *